Feb. 14, 1950 H. M. DRESSEL 2,497,662

DEVICE FOR TUNING HIGH-FREQUENCY CIRCUITS

Filed Aug. 29, 1947 2 Sheets-Sheet 1

Inventor

Henry M. Dressel

By Brown, Critchlow, Flick & Peckham

His Attorneys

Feb. 14, 1950 H. M. DRESSEL 2,497,662

DEVICE FOR TUNING HIGH-FREQUENCY CIRCUITS

Filed Aug. 29, 1947 2 Sheets-Sheet 2

Inventor
Henry M. Dressel

By Brown, Critchlow, Flick & Peckham
His Attorneys

Patented Feb. 14, 1950 2,497,662

UNITED STATES PATENT OFFICE 2,497,662

DEVICE FOR TUNING HIGH-FREQUENCY CIRCUITS

Henry M. Dressel, St. Marys, Pa., assignor to Stackpole Carbon Company, St. Marys, Pa., a corporation of Pennsylvania Application August 29, 1947, Serial No. 771,303

10 Claims. (Cl. 171—242)

This invention relates to the tuning of high frequency radio circuits, and more particularly to a variable inductance device suitable for such tuning.

In permeability tuning of a radio circuit it is desirable to be able to change the inductance of the circuit as much as possible in order to provide a wide tuning range. The greatest change in inductance is obtainable when the permeability of the iron core used in the tuning coil is greatest. However, the permeability of such a core is very low at high frequencies ranging from 100 to 200 megacycles and beyond. The fact that very fine iron particles, with resultant loss of apparent permeability, are required for making the core, contributes to this condition. With low permeability, it becomes very important to make the best possible use of the iron in the core, since the breadth of the tuning range will depend on how closely the iron core can be associated with the electrical circuit. A core in the shape of a toroid makes the best use of the iron, but the inductance can not be varied. At the very high frequencies just mentioned, very small inductance is needed in the circuit, but of course it should be variable. Therefore, ordinary tuning coils are not suitable for permeability tuning at high frequencies, because almost any length of wire required for a coil will have too much inductance, and even a very short coil would not be suitable anyway for it would not permit much change in inductance by moving the core axially of the coil.

It is among the objects of this invention to provide for high frequency circuits a tuning device which has very low inductance, which has a relatively wide tuning range, and which is simple and inexpensive in construction.

In accordance with this invention a powdered iron core is used which resembles a toroid that has been elongated axially. This core is capable of being moved into various positions of coupling with an electrical conductor which generally is the equivalent of one turn of a wire coil. To obtain a close relationship between the conductor and core with variations from very little to very high coupling, the core is provided with a radial slot extending lengthwise of it to allow the conductor to extend into the core and yet permit the core to be moved relative to the conductor. When either the core or the conductor is moved relative to the other, such as radially or lengthwise, the inductance is varied. The core may be either solid except for the slot, or be hollow. The conductor may take various forms, such as a wire or strip of metal bent into a loop, or a metal case in which the core slides. If a case is used, it has an inner element connected to one end of it and extending along the slot in the core.

Figure 1:
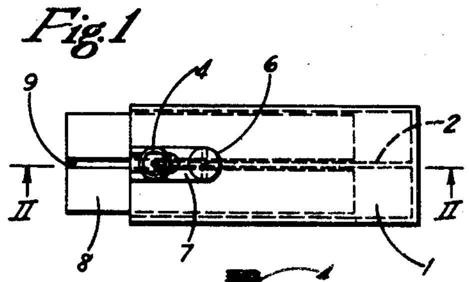
Figure 2:
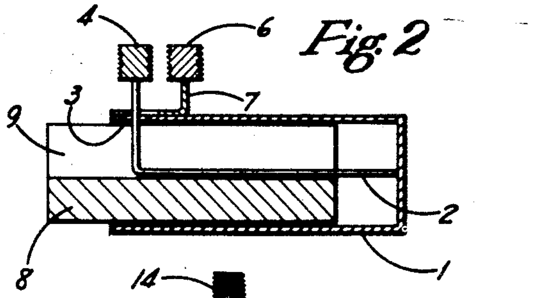
Figure 3:
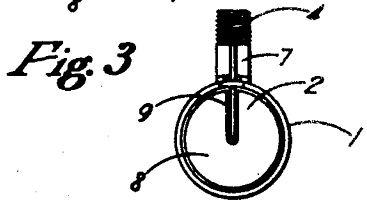
Figure 6:
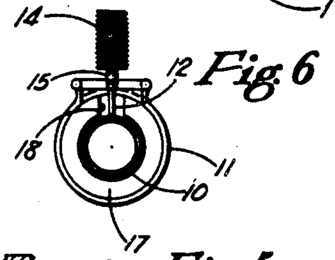
Figure 4:
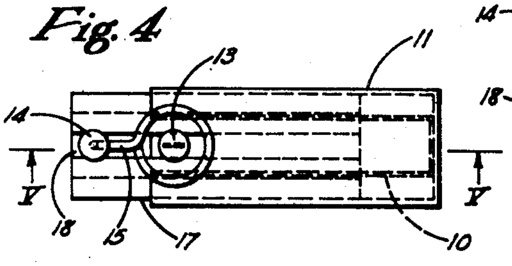
Figure 5:
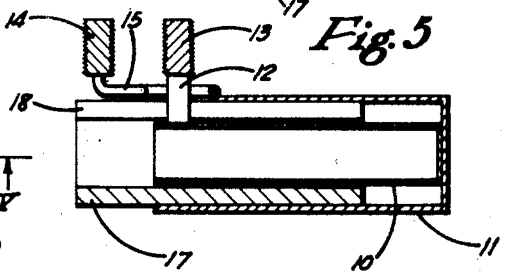
Figure 7:
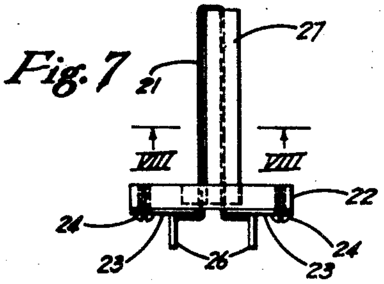
Figure 8:
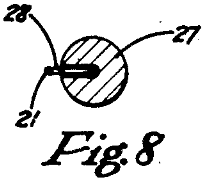
Figure 9:
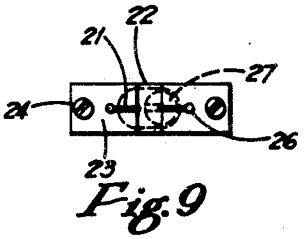
Figure 10:
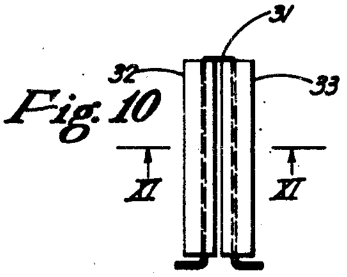
Figure 11:
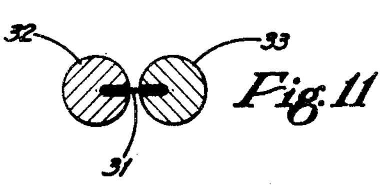
Figure 12:
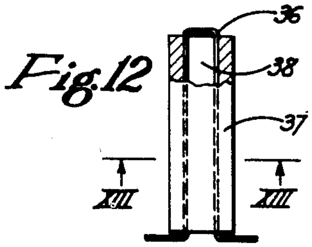
Figure 13:
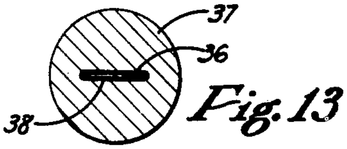
Figure 14:
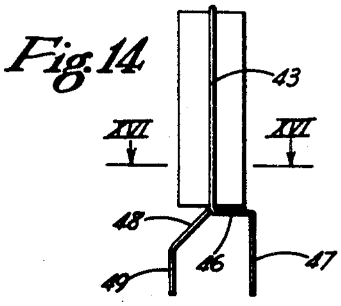
Figure 15:
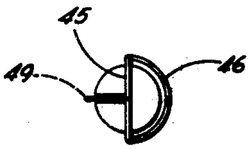
Figure 16:
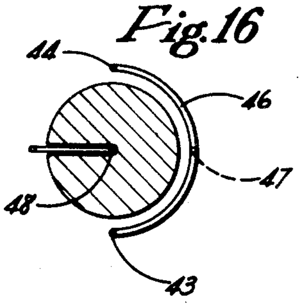
Figure 17:
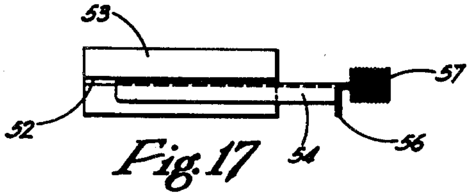
Figures 18, 19:
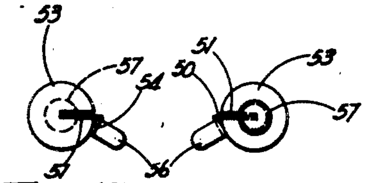
Figure 20:
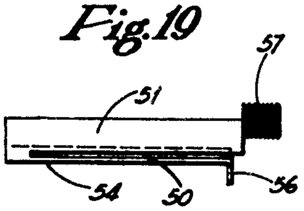
Figure 21:
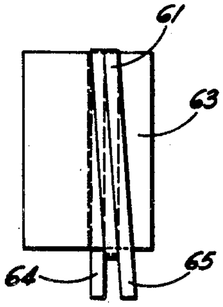
Figure 22:
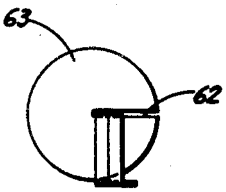

The invention is illustrated in the accompanying drawings in which Fig. 1 is a plan view of one embodiment; Fig. 2 is a longitudinal section taken on the line II—II of Fig. 1; Fig. 3 is an end view; Figs. 4, 5, and 6 are views similar to Figs. 1, 2, and 3, respectively, of another embodiment; Fig. 7 is a plan view of a further modification; Fig. 8 is a transverse section taken on the line VIII—VIII of Fig. 7; Fig. 9 is an end view; Figs. 10 and 11 are views similar to Figs. 7 and 8, respectively, of another modification; Figs. 12 and 13 are views similar to the two preceding views of still another form of the invention; Fig. 14 is a plan view of a further form; Fig. 15 is an end view thereof; Fig. 16 is an enlarged cross section taken on the line XVI—XVI of Fig. 14; Fig. 17 is a side view of another modification; Figs. 18 and 19 are opposite end views of this form; Fig. 20 is a plan view of the metal strip that is inserted in the core slot; Fig. 21 is a plan view of another embodiment of the invention; and Fig. 22 is an end view thereof.

Referring to Figs. 1, 2, and 3 of the drawings, a cylindrical metal case 1 has a closed inner end and an open outer end. Fastened to the center of the closed end is a metal strip or wire 2 which extends axially of the inside of the case to a point near its open end where the wire is bent at substantially a right angle and extends radially out of the case through the center of an enlarged opening 3 in the top of the case. The outer end of the wire above the case is provided with a suitable terminal, such as a threaded stud 4. Another threaded terminal 6 is electrically connected to the case near its open end, such as by a metal strip 7 soldered to the top of the case. These two terminals, which are close together to reduce inductance between them, are adapted to be connected into a high frequency circuit that it is desired to tune, the case and wire described thus far constituting an electrical conductor which corresponds to a single turn of a tuning coil.

The core 8 of the coil is formed in a well-known manner by compressing very fine iron particles or dust into a cylinder that is quite long in proportion to its diameter. The core is provided with a radial slot 9 that extends lengthwise of it from its inner end, preferably for its full length, and from its center to its periphery. This slot receives the wire 2 inside the case and permits the core to be moved lengthwise in the case without interference from the outturned portion of the wire. The slot, by permitting the wire to extend axially into the core, causes the core to resemble a split toroid through which part of a single turn of a coil extends, but the slot also allows this "single turn" to be moved into and out of the "toroid." Consequently, the inductance of the device can be varied either by sliding the core into and out of the case or by moving the case back and forth on the core, depending upon which of them is rigidly mounted. Any suitable means may be used for supporting one of the members and for moving the other member lengthwise relative to the stationary member. Although the various electrical characteristics of this device depend on its dimensions and the size of the particles from which the core is formed, it has been found that a tuning device having a core 2¼" long and ¾" in diameter provided with a radial slot $\frac{1}{32}$" wide and formed from iron particles of a size not exceeding 20 microns, has a tuning range as high as 26 megacycles. This was raised to 36 megacycles when the core was made only 1½" long and the other dimensions were reduced accordingly.

In the embodiment of the invention shown in Figs. 4, 5, and 6, an inner metal cylinder 10 has been substituted for the wire of the preceding figures. This cylinder is concentric with the outer cylinder or case 11 and has a closed inner end secured to the inner end of the case. Soldered to the outer end portion of the inner cylinder is a straight metal strip 12 that extends out through an opening in the top of the case. The upper end of this extension strip carries a threaded terminal member 13. Another terminal member 14 is secured to a projecting end of a wire 15 that has a loop soldered to the top of the case around and spaced from strip 12.

The powdered iron core 17 for this case is similar to the one previously described, except that it is hollow so that it can encircle the inner cylinder 10. The core is provided with a radial slot 18 extending lengthwise of it to receive extension strip 12 on the inner cylinder. As a result, either the core or the case can be moved lengthwise relative to the other to vary the inductance of the high frequency circuit in which the two terminal members 13 and 14 are connected.

Instead of surrounding the core with a metal case, a single turn of wire may be substituted for the case as shown in Figs. 7, 8 and 9. In this example the coil portion of the tuning device is formed from a wire 21 bent into the general shape of a hairpin to provide it with spaced parallel legs integrally connected at one end by a portion perpendicular to them. The opposite ends of the wire are shown extending through a mounting block 22 in front of which they are turned outwardly and soldered to metal plates 23 fastened to the block by screws 24. Projecting forward from these plates are a pair of terminal lugs 26 by which the wire can be connected into a circuit to be tuned. The iron core 27 for this wire loop is shaped like the one shown in Fig. 1 and is provided with a radial slot 28 through which one leg of the wire extends near the axis of the core. By sliding the core lengthwise away from and toward the mounting block, the amount of wire in the core will be varied and the inductance of the device therefore will be changed. Some variation in inductance also can be obtained by rotating the core on the leg of the wire extending through it.

The coil or wire 31 shown in Figs. 10 and 11 has substantially the same shape as the one shown in Fig. 7, but the legs of the loop are spaced farther apart and two iron cores 32 and 33 are used. Each coil has a radial slot which receives one of the legs of the wire. The inductance of the device can be varied by moving the cores lengthwise of the wire either simultaneously or independently of each other, by rotating the cores on the wire, or by moving the cores radially. The last movement permits a large change of inductance to be obtained with a very small movement of the cores.

The coil wire 36 shown in Figs. 12 and 13 is like those previously referred to, but in this case the iron core 37 has its radial slot 38 extending lengthwise through the center of the core with only the ends of the slot open. That is, the slot does not extend to the periphery of the core, so both legs of the wire loop are located inside of the core. Either the loop or the core must be moved lengthwise of the other to vary the inductance of this device.

The iron core 41 shown in Figs. 14, 15, and 16, like some of those described earlier, has a slot 42 extending lengthwise through it and radially from its center to its periphery. The electrical conductor looped around this core, however, is formed from two wires bent into special shapes and fastened together. Thus, one wire is bent into a closed loop having a pair of legs 43 and 44 connected at one end by a straight cross member 45. The opposite ends of the legs are connected by a curved wire section 46 having a longer radius than the core. From the center of this curved section a terminal lug 47 extends away from the end of the core. The other wire 48 extends through the core slot adjacent the center of the core and has one end soldered to the cross member 45 of the outer wire. The opposite end of this inner wire projects from the core and is bent to one side of it to form the other terminal 49 for connecting the wires in an electrical circuit to be tuned. The inductance of this device can be varied by moving the core away from cross member 45 and between terminals 47 and 49.

The electrical conductor of the tuning device shown in Figs. 17 to 20 is formed by bending a straight metal strip, provided with a longitudinal slot 50 (Fig. 20), lengthwise to form a portion 51 which extends into and along the slot 52 in the iron core 53, and another narrower portion 54 which extends along the outside of the core beside its slot. The free end of portion 54 is bent away from portion 53 to form a terminal 56. A suitable terminal member 57 may be attached to the adjacent end of the other portion of the strip. This conductor can be slid lengthwise of the core to vary the inductance of the device, or it can be moved radially of the core for the same purpose.

The electrical conductor of the embodiment shown in Figs. 21 and 22 is formed from a flexible metal strip wound into a coil flattened rectangular 61, one side of which extends through the radial slot 62 in the iron core 63. The ends of the strip form terminals 64 and 65 for connecting the coil into a high frequency circuit. The strip preferably makes only a couple of turns around the core, and the turns do not overlap but are side by side. Of course the core can not be moved lengthwise relative to the coil, but it can be moved radially to vary the inductance of the coil.

In none of these devices is it necessary to insulate the core from the cooperating metal member, because the electrical resistance of the core is so great that no appreciable amount of current will flow through it. Of course, if the resistance of the core is relatively low in any given instance, then it may be insulated from the other member.

According to the provisions of the patent statutes, I have explained the principle and construction of my invention and have illustrated and described what I now consider to represent its best embodiment. However, I desire to have it understood that, within the scope of the appended claims, the invention may be practiced otherwise than as specifically illustrated and described.

I claim:

1. A device for tuning a high frequency circuit, comprising an elongated high permeability core member provided with a radial slot extending lengthwise of it, and an electrical conductor member having ends adapted to be connected in said circuit, said conductor having a portion extending into said slot and lengthwise of the inside of the core and having another portion extending along the outside of the core lengthwise, whereby to provide small inductance for said circuit, and one of said members being movable relative to the other to vary said inductance.

2. A device for tuning a high frequency circuit, comprising a tubular metal case, an elongated high permeability core disposed in the case and slidable lengthwise through an open end thereof, said core being provided with a radial slot extending lengthwise of it, and a metal conductor element extending into said slot adjacent said open end of the case and then lengthwise of the inside of the core toward the opposite end of the case, one end of said element engaging the case, and one end of the case and the free end of said element being adapted to be connected in said circuit, whereby an inductive circuit is formed through said element and case which can be varied by sliding the core or case lengthwise relative to the other.

3. A device for tuning a high frequency circuit, comprising a tubular metal case having a closed end and an open end, an electric terminal connected to the case adjacent its open end, an elongated high permeability core disposed in the case and slidable lengthwise through its open end, said core being provided with a radial slot extending lengthwise of it, a metal conductor element extending into said slot adjacent the open end of the case and then lengthwise of the inside of the core and into engagement with the closed end of the case, and an electric terminal connected to the outer end of said element, said terminals being adapted to be connected in said circuit, whereby an inductive circuit is formed through said element and case which can be varied by sliding the core or case lengthwise relative to the other.

4. A device for tuning a high frequency circuit, comprising a tubular metal case having a closed end and an open end, an electric terminal connected to the case adjacent its open end, a high permeability core disposed in the case and slidable lengthwise through its open end, said core being tubular and provided with a radial slot extending lengthwise of it and into its interior, a metal element having its inner end secured to the closed end of the case and extending into the core, and a metal extension secured to the outer end of said element and projecting through said slot in spaced relation to the case, the outer end of said extension and the open end of the case being adapted to be connected in said circuit, whereby an inductive circuit is formed through said case and element and extension which can be varied by sliding the core lengthwise between said element and case.

5. A device for tuning a high frequency circuit, comprising a pair of radially spaced concentric metal cylinders secured together only at their inner ends, an extension member extending radially from the outer end of the inner cylinder and spaced from the outer cylinder, and an elongated high permeability core annular in cross section slidably mounted between said cylinders, said core being provided with a radial slot extending lengthwise of it for receiving said extension member, and the outer ends of said extension member and outer cylinder being adapted to be connected in said circuit, whereby an inductive circuit is formed through said member and cylinders which can be varied by sliding the core lengthwise between the cylinders.

6. A device for tuning a high frequency circuit, comprising an elongated high permeability core member provided with a radial slot extending lengthwise of it, and a wire member having ends adapted to be connected in said circuit, said wire having a portion extending into said slot and lengthwise of the inside of the core and having another portion extending along the outside of the core, whereby to provide small inductance for said circuit, and one of said members being movable lengthwise relative to the other to vary the amount of wire inside the core in order to vary said inductance.

7. A device for tuning a high frequency circuit, comprising an elongated high permeability core provided with a radial slot extending lengthwise of it, and a length of metal bent to provide a pair of substantially parallel legs integrally connected at one end and with their free ends adapted to be connected in said circuit, one of said legs extending lengthwise of said slot adjacent the axis of the core, the other leg extending along the outside of the core, whereby to provide small inductance for said circuit, said core and metal legs being movable relative to each other to vary said inductance.

8. A device for tuning a high frequency circuit, comprising an elongated high permeability core member provided with a radial slot extending lengthwise of it, and a wire member bent to provide a pair of substantially parallel legs integrally connected at one end and with their free ends adapted to be connected in said circuit, at least one of said legs extending lengthwise of the inside of said slot, and one of said members being movable relative to the other to vary the amount of wire inside the core, whereby to produce variable inductance for said circuit.

9. A device for tuning a high frequency circuit, comprising an elongated high permeability core member provided with a radial slot extending lengthwise of it, and an electrical conductor member having ends adapted to be connected in said circuit, said conductor having substantially parallel straight portions extending lengthwise of the core member, one of said portions extending from one of said ends into said slot and lengthwise of the inside of the core member, and the other of said portions extending lengthwise of the outside of the core member, whereby to provide small inductance for said circuit, one of said members being movable relative to the other to vary said inductance.

10. A device for tuning a high frequency circuit comprising an elongated high permeability core member provided with a radial slot extending lengthwise of it, and a longitudinally slotted metal strip member bent lengthwise to form two spaced straight portions integrally connected at one end, the free ends of said strip portions being adapted to be connected in said circuit, one of said portions extending into said core slot and lengthwise of the inside of the core, the other of said strip portions extending along the outside of the core lengthwise thereof beside the core slot, whereby to provide small inductance for the circuit, and one of said members being movable lengthwise relative to the other to vary the amount of strip inside the core in order to vary said inductance.

HENRY M. DRESSEL.

REFERENCES CITED

The following references are of record in the file of this patent:

UNITED STATES PATENTS

| Number | Name | Date |
|---|---|---|
| 2,109,843 | Kassner | Mar. 1, 1938 |
| 2,450,192 | Freeman | Sept. 28, 1948 |

FOREIGN PATENTS

| Number | Country | Date |
|---|---|---|
| 405,043 | Great Britain | Feb. 1, 1934 |

Certificate of Correction

Patent No. 2,497,662 February 14, 1950

HENRY M. DRESSEL

It is hereby certified that errors appear in the printed specification of the above numbered patent requiring correction as follows:

Column 5, lines 26 and 27, after the word "extending" insert *from one of said ends*; line 29, after "lengthwise" and before the comma insert *thereof*;

and that the said Letters Patent should be read with these corrections therein that the same may conform to the record of the case in the Patent Office.

Signed and sealed this 16th day of May, A. D. 1950.

[SEAL]

THOMAS F. MURPHY,
*Assistant Commissioner of Patents.*